(12) United States Patent
Virtanen et al.

(10) Patent No.: US 8,549,924 B2
(45) Date of Patent: *Oct. 8, 2013

(54) PRESSURE COMPENSATOR

(75) Inventors: Esa Virtanen, Vaasa (FI); Thorvald Haldin, Kuni (FI); Kim Missing, Merikaarto (FI)

(73) Assignee: ABB Technology AG, Zürich (CH)

( * ) Notice: Subject to any disclaimer, the term of this patent is extended or adjusted under 35 U.S.C. 154(b) by 82 days.

This patent is subject to a terminal disclaimer.

(21) Appl. No.: 13/071,114

(22) Filed: Mar. 24, 2011

(65) Prior Publication Data

US 2011/0203379 A1    Aug. 25, 2011

Related U.S. Application Data

(63) Continuation of application No. PCT/FI2009/050740, filed on Sep. 16, 2009.

(30) Foreign Application Priority Data

Sep. 24, 2008    (EP) .................................... 08164976

(51) Int. Cl.
*G01L 19/04*    (2006.01)
*F16L 55/04*    (2006.01)
(52) U.S. Cl.
USPC ............................ 73/708; 73/170.29; 138/30
(58) Field of Classification Search
USPC .................................................. 73/700–756
See application file for complete search history.

(56) References Cited

U.S. PATENT DOCUMENTS

| 2,700,306 A | 6/1954 | Johnson |
| 3,074,435 A | 1/1963 | Woestemeyer |
| 3,850,231 A | 11/1974 | Creek |
| 4,266,888 A | 5/1981 | Bayer et al. |

(Continued)

FOREIGN PATENT DOCUMENTS

| CN | 201054295 Y | 4/2008 |
| EP | 0281685 A1 | 9/1988 |

(Continued)

OTHER PUBLICATIONS

International Search Report (PCT/ISA/210) issued on Dec. 18, 2009, by Finnish Patent Office as the International Searching Authority for International Application No. PCT/FI2009/050740.

(Continued)

*Primary Examiner* — Andre Allen
(74) *Attorney, Agent, or Firm* — Buchanan Ingersoll & Rooney PC

(57) ABSTRACT

A pressure compensator is configured to compensate for volume variations of an insulation medium of a subsea installation. The pressure compensator includes a first bellows chamber having walls and a first bellows part. The first bellows chamber is in flow connection with an insulation medium chamber of the subsea installation, and the walls of the first bellows chamber are configured to separate the insulating medium from surroundings. The first bellows chamber is surrounded by a second bellows chamber having walls and a second bellows part. The second bellows chamber is configured to form a closed intermediate space around the first bellows chamber. The walls of the second bellows chamber are configured to separate at least the bellows parts of the first bellows chamber from the surrounding sea water. The second bellows chamber is further filled with an intermediate medium.

15 Claims, 2 Drawing Sheets

(56) References Cited

U.S. PATENT DOCUMENTS

| | | | |
|---|---|---|---|
| 4,997,009 | A | 3/1991 | Niikura et al. |
| 5,618,629 | A | 4/1997 | Takamatsu et al. |
| 5,797,430 | A | 8/1998 | Becke et al. |
| 5,893,681 | A | 4/1999 | Boden et al. |
| 6,041,820 | A | 3/2000 | Boehme |
| 6,056,013 | A | 5/2000 | Sasaki et al. |
| 7,847,189 | B2 | 12/2010 | Findeisen |
| 2003/0075225 | A1 | 4/2003 | Dinkel et al. |
| 2004/0051615 | A1 | 3/2004 | Hafskjold et al. |
| 2007/0074872 | A1 | 4/2007 | Du et al. |
| 2011/0226369 | A1* | 9/2011 | Uusipaikka .................. 138/30 |

FOREIGN PATENT DOCUMENTS

| | | | |
|---|---|---|---|
| GB | 1023452 A | | 3/1966 |
| GB | 1 600 095 A | | 10/1981 |
| GB | 2 381 667 B | | 11/2004 |
| JP | 56-162815 A | | 12/1981 |
| JP | 6-310343 A | | 11/1994 |
| JP | 9-176766 A | | 7/1997 |
| JP | 2000-46181 A | | 2/2000 |
| WO | 99/63555 A2 | | 12/1999 |
| WO | 2007/003595 A1 | | 1/2007 |
| WO | WO 2007/055588 A1 | | 5/2007 |

OTHER PUBLICATIONS

Written Opinion (PCT/ISA/237) issued on Dec. 18, 2009, by Finnish Patent Office as the International Searching Authority for International Application No. PCT/FI2009/050740.

International Search Report (PCT/ISA/210) issued on Dec. 18, 2009, by Finnish Patent Office as the International Searching Authority for International Application No. PCT/FI2009/050741.

Written Opinion (PCT/ISA/237) issued on Dec. 18, 2009, by Finnish Patent Office as the International Searching Authority for International Application No. PCT/FI009/050741.

European Search Report dated May 5, 2009 for European Application No. 08164976.6.

Office Action issued on Oct. 3, 2012 by the USPTO in corresponding U.S. Appl. No. 13/071,125.

Office Action dated Mar. 11, 2013 issued by the Russian Patent Office in corresponding Russian Application No. 2010129215/07, and an English translation thereof.

B. Bjerkreim et al., "Ormen Lange Subsea Compression Pilot", 2007 Offshore Technology Conference, Houston, Texas, USA, 30 Apr. 30-May 3, 2007 (OTC 81969), pp. 1-11.

Notice of Opposition, dated May 29, 2013, issued in European Patent Application No. 200801164976.

* cited by examiner

PRESSURE COMPENSATOR

RELATED APPLICATION

This application claims priority as a continuation application under 35 U.S.C. §120 to PCT/FI2009/050740, which was filed as an International Application on Sep. 16, 2009 designating the U.S., and which claims priority to European Application 08164976.6 filed in Europe on Sep. 24, 2008. The entire contents of these applications are hereby incorporated by reference in their entireties.

FIELD

The present disclosure relates to a pressure compensator configured to compensate volume variations of an insulation medium or other liquid of a subsea installation.

BACKGROUND INFORMATION

Subsea installations are assemblies used under water. Such assemblies can be installed, for example, on the bottom ground of a body of water. Power transformers are an example of subsea installations which can be used under water. Generally, power transformers use an insulation medium. For example, the power transformers can be fluid insulated having transformer oil in a transformer tank. Examples of other subsea liquid filled objects are subsea motors, subsea switchgears, subsea converters, rectifiers and hydraulic store tanks.

The subsea installations described above are used, for example, in modern oil and gas production in which the collection, separation, boosting and transport of production fluids takes place on the seabed. These processes require large amounts of power that has to be transferred from a remote location at suitable voltages and currents to achieve minimum power loss, to the subsea installations. The transport of the power can take place at high voltages and low current to ensure minimum losses. When the power arrives at the subsea location, the power has to be transformed into more usable voltages and currents for the various specific subsea applications, such as the powering of pumps and compressors, for example.

The large power requirements result in the need for large transformers to be placed in a protective environment inside a large vessel, e.g. a tank. The transformer tank is filled with an insulating medium that ensures optimal working conditions for the transformer over many years. Transformer oil that contributes towards dissipating heat and preventing shorts and flashovers is a common example of such an insulating medium. In new big subsea transformers, the size of the transformer tank can be in the order of 10-30 cubic meters containing 10,000 to 30,000 litres of transformer oil. The water temperature variations, heat produced by the transformer and the properties of transformer oil result in oil volume variation in the order of several hundred litres or more. As the size of a transformer tank increases, the problems and need for compression and expansion also increase accordingly.

Subsea installations such as subsea transformers need pressure compensators to keep the pressure of the insulation medium used, for example the pressure of oil inside the transformer, close to the water pressure outside the transformer to avoid heavy mechanical structures against pressure. Also, cooling is easier when thinner wall thickness can be applied. The hydrostatic pressure of the water will increase circa 10 bars for each 100 m water depth increase, and the pressure difference between the oil inside and the water outside should typically be less than 1 bar. The subsea transformers filled with insulation oil will be exposed to oil compression and expansion due to temperature variation of the surrounding, due to load variation also causing a variation of the oil temperature and due to hydrostatic pressure of the sea water. The oil volume variation due to temperature variation is caused by a property of the oil having a non-zero thermal expansion coefficient, and the oil volume variation due to pressure variation is caused by close to zero pressure-volume coefficient of the oil.

From the point of view of construction and reliability, the transformer vessels or other equipment tanks described above are known to be rigid and constant volume structures. When transformer or equipment sizes are increasing, this means that the pressure inside the transformer or other equipment must be close to water pressure around the transformer or the other equipment. Owing to the factors above, the subsea transformers or the other equipment are equipped with one or several pressure compensators to keep the oil pressure inside the transformer close to the water pressure outside the transformer. The pressure compensators are structures with variable volume oil or other liquid filled containers outside the transformer or the other equipment. The variable volume containers are also in flow connection with the transformer oil space or the other equipment liquid space.

There are several different solutions for subsea pressure compensators. WO 2007/055588 A1 and U.S. Patent Application US 2004/0051615 A1 are examples of known solutions. All known subsea pressure compensators, such as those mentioned above, for example, have only one wall or barrier between the sea water and the inside of the oil volume. This means that if one barrier or wall will have a failure producing leakage between the oil and the water, the water will enter into the transformer causing electrical failure of the transformer and thereby affect the operation of the transformer. The other equipment will have also serious consequences such as electrical failures if the water will leak in. Such leak problems relate mainly to corrosion caused by the sea water, because known pressure compensators are not particularly resistant against corrosion caused by sea water. The sensitivity of the corrosion may be a risk with metallic bellows type pressure compensators because the wall of the bellows should be very thin to reach required flexibility. This may be the situation even when cathodic protection will be used.

There are also known solutions with which properties of different bellows structures against corrosion are improved. JP 9176766, JP 2000046181, EP 0 281 685 and U.S. Pat. No. 5,893,681 are examples of such solutions. These known solutions are not, however, suitable in subsea conditions.

SUMMARY

An exemplary embodiment of the present disclosure provides a pressure compensator configured to compensate volume variations of an insulation medium or other liquid of a subsea installation. The exemplary pressure compensator includes a first bellows chamber. The first bellows chamber includes first walls and a first bellows part. The first bellows chamber is in flow connection with an insulation medium or liquid chamber of the subsea installation. The first walls of the first bellows chamber are configured to separate the insulating medium from surrounding sea water. The exemplary pressure compensator also includes a second bellows chamber surrounding the first bellows chamber. The second bellows chamber includes second walls and a second bellows part. The second bellows chamber is configured to form a closed intermediate space around the first bellows chamber. The second walls of the second bellows chamber are configured to separate at least the first bellows part of the first bellows chamber from the surrounding sea water. The second bellows chamber is filled with an intermediate medium.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Exemplary embodiments of the present disclosure provide a pressure compensator which eliminates the problems of known solutions. Exemplary embodiments of the present disclosure provide a pressure compensator in which a first bellows chamber is surrounded by a second bellows chamber. The first bellows chamber includes a first bellows part, and the second bellows chamber includes a second bellows part. The second bellows chamber is configured to form a closed intermediate space around the first bellows chamber. The walls of the second bellows chamber are configured to separate at least the first bellows part of the first bellows chamber from the surrounding sea water. The second bellows chamber is filled with a intermediate medium, and the second bellows part of the second bellows chamber being made of a material resistant to surrounding sea water.

Exemplary embodiments of the present disclosure advantageously eliminate the problems relating to sea water corrosion. The present disclosure is also simple and therefore manufacturing and maintenance costs are low.

Figure 1:
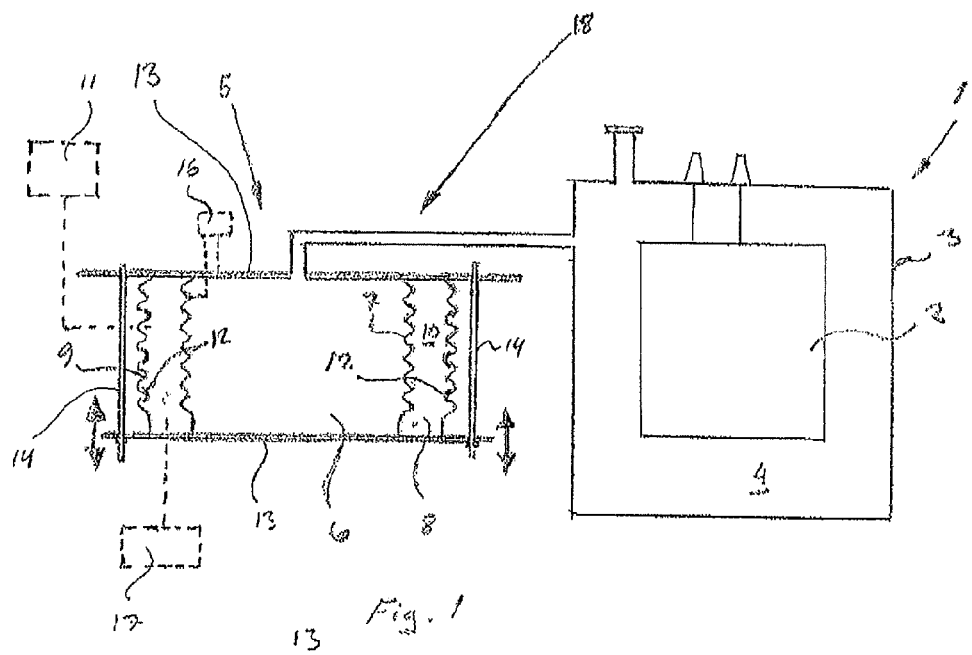
FIG. 1 shows schematically the basic structure and operation principle of a pressure compensator according to an exemplary embodiment of the present disclosure.

FIG. 1 shows schematically the basic structure of an exemplary embodiment of the present disclosure and how the present disclosure operates in connection with a subsea installation. In the example of FIG. 1, the subsea installation is a subsea transformer. Reference number 1 shows generally the subsea transformer. The subsea transformer 1 includes a transformer unit 2 and a tank 3. The tank 3 is filled with an insulation medium 4, e.g., transformer oil. The tank 3 forms an insulation chamber around the transformer unit 2.

A pressure compensator 5 is provided in order to compensate for volume variations of the insulating medium 4. The pressure compensator 5 includes a first bellows chamber 6. The first bellows chamber 6 includes a first bellows part 7. The first bellows part 7 is made of a suitable material, for example, steel.

The first bellows chamber 6 is arranged through a pipe or channel system 18 in flow connection with the insulation chamber formed by the tank 3 so that the first bellows chamber 6 can compensate for volume variations of the insulating medium 4.

The assembly shown in FIG. 1 is wholly surrounded with sea water, e.g., the assembly is placed on the bottom of the sea.

The aforementioned features illustrated in FIG. 1 are known in the art and are therefore not described herein in further detail.

As noted above, the drawbacks with known solutions relate to corrosion damages in the bellows part of the pressure compensator, e.g., sea water causes corrosion problems in the first bellows part.

According to an exemplary embodiment of the present disclosure, the first bellows chamber 6 is surrounded by a second bellows chamber 8, which includes a second bellows part 9. The second bellows chamber 8 is configured to form a closed intermediate space around the first bellows chamber 6. The walls of the second bellows chamber 8 are configured to separate at least the bellows parts 7 of the first bellows chamber 6 from the surrounding sea water. The second bellows chamber 8 is further filled with an intermediate medium 10. The second bellows part 9 of the second bellows chamber 8 can be made of a material resistant to surrounding sea water, for example.

In other words, the expansive and compressive element of the pressure compensator has two barriers or walls between transformer related space and seawater.

The inner barrier, e.g., the first bellows part 7 in FIG. 1, is made of metallic bellows construction, and the outer barrier, e.g., the second bellows part 9 is made of rubber material or rubber like material, for example. The rubber like material can be, for example, an appropriate plastic material or a mixture with rubber material and plastic material. The space between the first bellows part 7 and the second bellows part 9, e.g., the second bellows chamber 8 in FIG. 1, is filled with the same transformer oil or oil which is mixable with the transformer oil 4 in the first bellows chamber 6 and in the tank 3. There is, however, no exchange of oil through the first bellows part 7.

The second bellows part 9 made of rubber material or other similar material protects the first bellows part 7 made of metal material from corrosion. In this regard, it is important to realise that the first bellows part 7, due to desired flexibility, must have a typically thin wall construction, and therefore corrosion matters are very important with regard to the operation of the device. The wall thickness of the first bellows part 7 can be in 1 mm scale, for example. In order to have more flexibility and reliability, the first bellows part 7 can also be constructed with one or more metallic layers.

The small volume changes of the closed intermediate oil space, e.g., the second bellows chamber 8 between the first and the second bellows parts must also be compensated. This is carried out, for example, by making the second bellows part 9 so that it is able also to expand in the radial direction due to pressure variation or by using an additional small pressure compensator 11 connected to the intermediate space, e.g., to the second bellows chamber 8. The eventual additional small compensator 11 can have one barrier construction without loosing the double barrier feature of the whole pressure compensator.

The rubber material used in the second bellows part 9 can be, for example, Nitrile rubber, which is resistant against sea water and after suitable treatment compatible with the transformer oil.

The second bellows part 9 can be made wholly of such rubber or rubber like material. It is, however, quite possible to put appropriate strengthening material or several strengthening materials to the bellows part material, for example inside of the bellows wall as shown with reference number 12 in FIG. 1.

In this regard, it is important to realize that it is quite possible instead of the rubber material bellows to use the second bellows part 9 made of steel material. The steel material used can, for example, be selected so that it is as resistant as possible against sea water. The second bellows part 9 made of steel also protects efficiently the first bellows part 7 against corrosion caused by sea water before the second bellows part 9 is corroded. The pressure compensator can however be changed before the first bellows is corroded.

The other walls of the pressure compensator, which are not changing their shape and size, for example end walls 13 of the tubular form bellows parts, can be made, for example, of thick enough one layer metallic material, like e.g. stainless steel plates. The walls can, however, be a two-layer construction like rubber material/metal material walls, for example.

Figure 2:
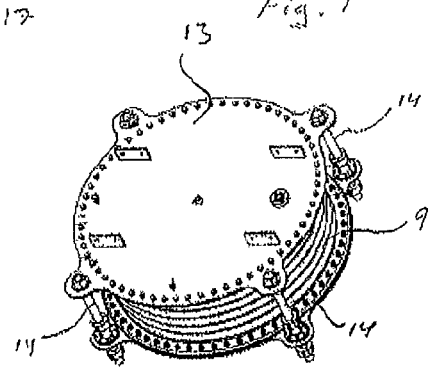
FIGS. 2-5 show exemplary embodiments of the present disclosure.
Figure 3:
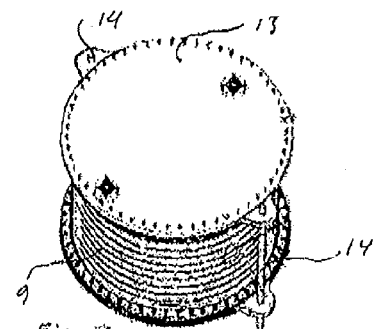
Figure 4:
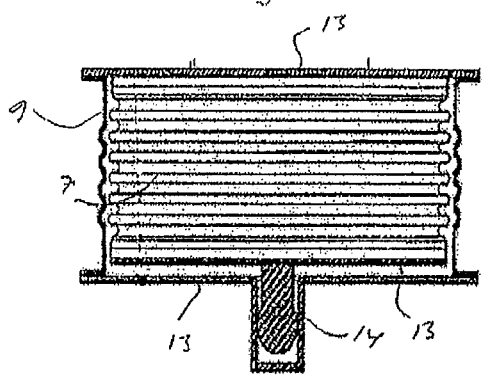
Figure 5:
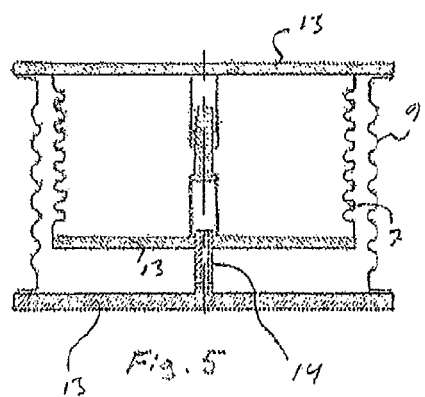

According to an exemplary embodiment, the pressure compensator can also be provided with guiding rods 14 for guiding the first and the second bellows parts to move during compression and/or expansion along defined paths. The compression and expansion movements of the bellows parts are shown by arrows in FIG. 1. The number of the guiding rods can be chosen freely according to the existing need. It is quite possible, for example, to materialize the pressure compensator without the guiding rods. FIG. 2 shows an exemplary embodiment of the present disclosure with four guiding rods 14, and FIG. 3 shows another exemplary embodiment of the disclosure with two guiding rods 14. In the exemplary embodiments of FIGS. 1-3, the guiding rods 14 are located circumferentially outside the bellows parts. This placement is, however, not the only possibility. For example, the guiding rods 14 can also be placed in the bellows parts 7, 9. FIGS. 4 and 5 illustrate an exemplary embodiment in which one guiding rod is used and the guiding rod 14 is placed centrally in the bellows parts. The end plates 13 are also materialized differently in the embodiments of FIGS. 4 and 5 when compared to the embodiments of FIGS. 1-3. In the embodiments of FIGS. 4 and 5, the first bellows part 7 and the second bellows part 9 both have at one end thereof an end plate of its own, and use a common end plate at the other ends thereof.

Figure 6:
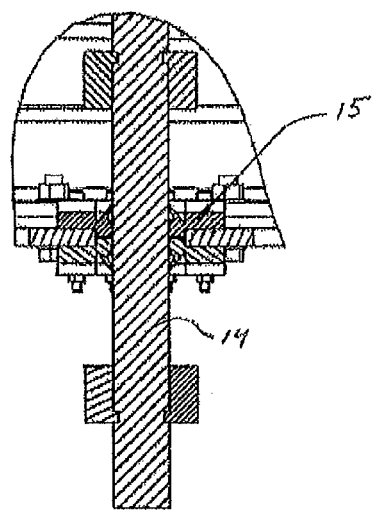
FIG. 6 shows structural detail of an exemplary embodiment of the present disclosure.

The guiding rods 14 of the pressure compensator are moveably connected with guiding bushings 15 around the guiding rods 14 to the movable parts of the pressure compensator. The material of the guiding bushings 15 is selected so that the bushings do not easily jam and so that moving bushings will keep the surfaces of the guiding rods clean 14 from marine fouling and other eventual impurities, which might cause jamming. Any appropriate material can be used for the guiding bushings 15, for example, several plastic materials are suitable. Nylon is an example of a particularly suitable material. FIG. 6 shows an exemplary embodiment in which the guiding bushings 15 can be materialized, for example, in the embodiments shown for example in FIGS. 2 and 3. The guiding bushings 15 can be made as replaceable parts.

The guiding bushings 15 of the guiding rods 14 can, however, be made so that if the guiding rods 14 should jam, the bushings 15 will break due to compression and expansion movement forces and the breaking will release the jamming. After that the wider metallic part of the bushing will guide the movements. Nylon is a suitable material to have this breaking feature.

The guiding rods 14 and the related bushings 15 can also be formed so that they can also be used as indicators of the pressure compensator operation state as indicating the bushing position, e.g., the guiding rod arrangement can also act as an indicator of the movements of the bellows parts. The bushing position can be inspected by any appropriate ROV (Remote Operate Vehicle) camera when the rods are on the outer surface of the outer expanding and compressing barrier.

The number of the pressure compensators connected parallel to the subsea installation, for example, to the subsea transformer or to some other possible object to be compensated, can be selected so that the total oil volume required can be compensated.

The pressure compensator can also include electrically based corrosion protection means or some other type of corrosion protection means. For example, the corrosion protection means can also be situated inside the pressure compensator to protect the first bellows part made of metal material. Reference number 16 in FIG. 1 shows schematically such corrosion protection means.

The pressure compensator of the present disclosure can also be provided with monitor means for monitoring the amount of sea water eventually leaked into the intermediate space, e.g., into the second bellows chamber 8. Reference number 17 in FIG. 1 shows such monitoring means.

Figure 7:
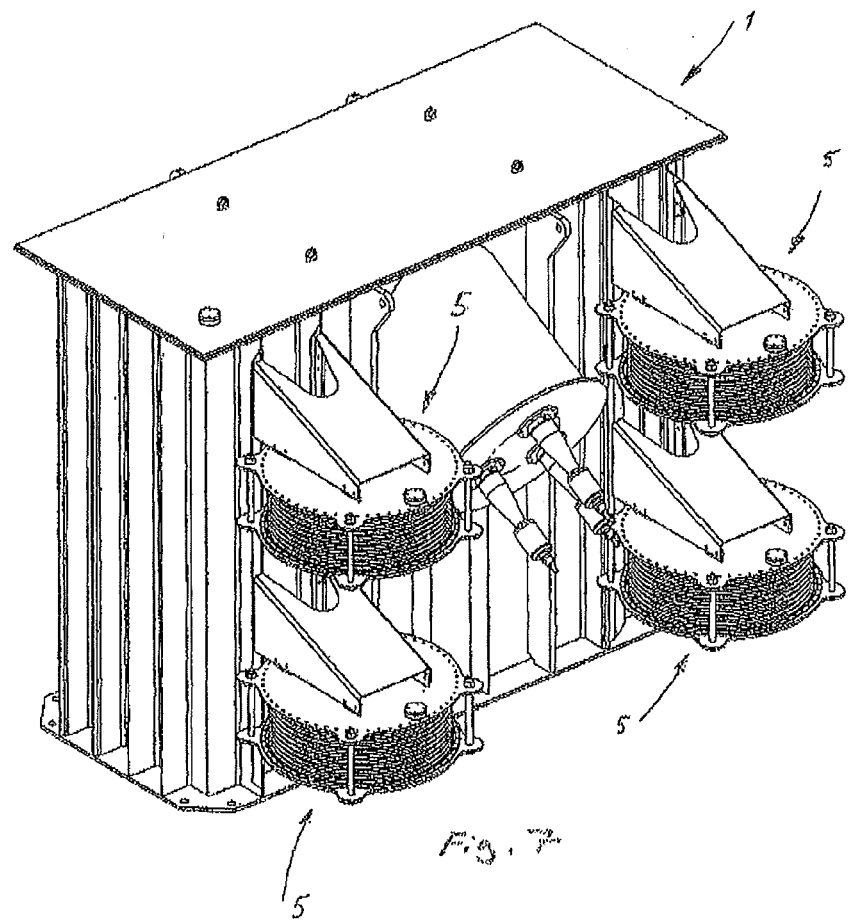
FIG. 7 shows schematically a subsea transformer provided with pressure compensators according to an exemplary embodiment of the present disclosure.

As discussed above, the number of the pressure compensators used in connection with a subsea installation can vary according to the existing need. For example, the compensation volume of the pressure compensators required in near future big subsea transformers in hundreds of litres, for example 200 litres, and typical number of compensators needed in one big subsea transformer is from 2 to 6 compensator units. As an example, FIG. 7 shows a subsea transformer with four pressure compensators.

The exemplary embodiments described above are not intended to restrict the invention but only to clarify the basic idea of the disclosure. It is quite clear that details can be varied freely within the scope of the claims. The disclosure is described here in connection with subsea transformers. The disclosure is however not restricted solely to subsea transformers but the disclosure can also be used in connection with all subsea installations using insulation medium and needing compensation of said insulation medium etc. Insulation medium need not be transformer oil but any other medium or fluid can be used according to the existing need.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A pressure compensator configured to compensate volume variations of an insulation medium or other liquid of a subsea installation, comprising: a first bellows chamber including two end walls and a first bellows part, the first bellows chamber being in flow connection with an insulation medium or liquid chamber of the subsea installation, and the two end walls of the first bellows chamber being configured to separate the insulating medium from surrounding sea water; and a second bellows chamber surrounding the first bellows chamber, the second bellows chamber including at least one of the two end walls and a second bellows part, the second bellows chamber being configured to form a closed intermediate space around the first bellows chamber, the at least one of the two end walls of the second bellows chamber being configured to separate at least the first bellows part of the first bellows chamber from the surrounding sea water, the second bellows chamber being filled with an intermediate medium.

2. The pressure compensator of claim 1, wherein the second bellows part of the second bellows chamber is made of a material resistant to surrounding sea water.

3. The pressure compensator of claim 2, wherein the second bellows part is made of one of rubber, plastic material, and a mixture of the rubber and plastic material.

4. The pressure compensator of claim 1, wherein the second bellows part is made of steel material.

5. The pressure compensator of claim 1, wherein the second bellows part of the second bellows chamber is configured to compensate for volume changes of the intermediate medium.

6. The pressure compensator of claim 1, comprising an additional pressure compensator arranged in the closed intermediate space, the additional pressure compensator being configured to compensate for volume changes of the intermediate medium.

7. The pressure compensator of claim 1, wherein the intermediate medium is the same medium as the insulation medium of the subsea installation or a medium mixable with the insulation medium of the subsea installation.

8. The pressure compensator of claim 3, wherein the second bellows part is provided with a strengthening material or materials.

9. The pressure compensator of claim 1, wherein the first and the second bellows parts are tubular parts, and the pressure compensator comprises at least one guiding rod arrangement configured to guide the first and the second bellows parts to move along defined paths.

10. The pressure compensator of claim 9, wherein the at least one guiding rod arrangement comprises guiding bushings including replaceable parts, the replaceable parts being configured to break due to compression or expansion movement forces created by the bellows parts if the forces exceed a pre-determined level so that after breaking remaining parts of the bushings carry out guiding.

11. Pressure compensator of claim 9, wherein the guiding rod arrangements are configured to act as an indicator of movements of the bellows parts.

12. Pressure compensator of claim 1, comprising at least one measuring element arranged in the intermediate space, the at least one measuring element being configured to monitor eventual amount of sea water in the intermediate space.

13. The pressure compensator of claim 1, wherein the pressure compensator comprises corrosion protecting means.

14. The pressure compensator of claim 1, wherein the subsea installation is a subsea transformer.

15. The pressure compensator of claim 14, wherein the insulation medium is transformer oil.

* * * * *